United States Patent
Michigami

(10) Patent No.: US 10,581,401 B2
(45) Date of Patent: Mar. 3, 2020

(54) MODULE DEVICE

(71) Applicant: Murata Manufacturing Co., Ltd., Nagaokakyo-shi, Kyoto-fu (JP)

(72) Inventor: Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/057,841

(22) Filed: Aug. 8, 2018

(65) Prior Publication Data

US 2018/0351532 A1 Dec. 6, 2018

Related U.S. Application Data

(63) Continuation of application No. PCT/JP2016/085137, filed on Nov. 28, 2016.

(30) Foreign Application Priority Data

Feb. 22, 2016 (JP) .................... 2016-031112

(51) Int. Cl.
*H03H 9/05* (2006.01)
*H03H 9/10* (2006.01)
*H03H 9/02* (2006.01)
*H03H 9/145* (2006.01)
*H03H 9/64* (2006.01)

(52) U.S. Cl.
CPC ........ *H03H 9/059* (2013.01); *H03H 9/02559* (2013.01); *H03H 9/0542* (2013.01); *H03H 9/1092* (2013.01); *H03H 9/14544* (2013.01); *H03H 9/64* (2013.01)

(58) Field of Classification Search
CPC ............. H03H 9/02559; H03H 9/0542; H03H 9/0547; H03H 9/058; H03H 9/059; H03H 9/1092; H03H 9/14544; H03H 9/64; H01L 23/04; H01L 23/49827; H01L 41/053
USPC ......................................... 333/133, 193, 195
See application file for complete search history.

(56) References Cited

U.S. PATENT DOCUMENTS

2001/0022545 A1* 9/2001 Ohashi ................. H03H 9/6483
333/193
2006/0249825 A1* 11/2006 Nakano .................. H03H 9/059
257/678
2008/0284540 A1 11/2008 Nishihara et al.
(Continued)

FOREIGN PATENT DOCUMENTS

JP 2007-184690 A * 7/2007
JP 2008-271230 A 11/2008
(Continued)

OTHER PUBLICATIONS

Official Communication issued in International Patent Application No. PCT/JP2016/085137, dated Feb. 7, 2017.

*Primary Examiner* — Barbara Summons
(74) *Attorney, Agent, or Firm* — Keating & Bennett, LLP

(57) ABSTRACT

A module device includes electrode lands and signal wires on an upper surface defining one main surface of a module substrate. A filter chip is mounted on the module substrate. The filter chip includes first bumps connected to a signal potential, second bumps connected to a ground potential, and a third bump not electrically connected to a functional electrode portion. In a mount region, the third bump which is a floating bump is electrically connected to the signal wire.

16 Claims, 3 Drawing Sheets

(56) References Cited

U.S. PATENT DOCUMENTS

| | | | |
|---|---|---|---|
| 2010/0148887 A1* | 6/2010 | Matsuda | H03H 9/02992 333/133 |
| 2012/0086524 A1* | 4/2012 | Komura | H03H 9/725 333/195 |
| 2012/0286896 A1* | 11/2012 | Takamine | H03H 9/6483 333/133 |
| 2014/0113571 A1* | 4/2014 | Fujiwara | H04B 1/40 455/73 |
| 2014/0368296 A1 | 12/2014 | Nishizawa | |
| 2014/0368299 A1* | 12/2014 | Yamashita | H03H 9/059 333/195 |

FOREIGN PATENT DOCUMENTS

| | | |
|---|---|---|
| JP | 2011-049991 A | 3/2011 |
| JP | 2014-082609 A | 5/2014 |
| JP | 2015-002511 A | 1/2015 |

\* cited by examiner

MODULE DEVICE

CROSS REFERENCE TO RELATED APPLICATIONS

This application claims the benefit of priority to Japanese Patent Application No. 2016-031112 filed on Feb. 22, 2016 and is a Continuation Application of PCT Application No. PCT/JP2016/085137 filed on Nov. 28, 2016. The entire contents of each application are hereby incorporated herein by reference.

BACKGROUND OF THE INVENTION

1. Field of the Invention

The present invention relates to a module device including a filter chip mounted on a module substrate.

2. Description of the Related Art

Various module devices including one or more electronic component chips mounted on a module substrate have been proposed. Japanese Unexamined Patent Application Publication No. 2011-49991 discloses a structure in which a surface acoustic wave chip is mounted on a circuit substrate as a module substrate. The surface acoustic wave chip includes a columnar conductor which is not electrically connected to an interdigital transducer electrode. The columnar conductor is exposed at the module substrate side. That is, the columnar conductor in an electrically floating state is exposed at the side at which the surface acoustic wave chip opposes the circuit substrate. The columnar conductor is joined to a ground pad on the circuit substrate by solder or the like. Accordingly, the joining strength of the surface acoustic wave chip to the circuit substrate is enhanced.

In Japanese Unexamined Patent Application Publication No. 2011-49991, the columnar conductor, which is not electrically connected to the interdigital transducer electrode, needs to be joined to the ground pad on the circuit substrate. Therefore, on the module substrate, there are limitations on arrangement of a signal wire in a mount region for the surface acoustic wave chip. Accordingly, it is impossible to achieve sufficient size reduction of the module device.

SUMMARY OF THE INVENTION

Preferred embodiments of the present invention provide module devices which have increased flexibility in arrangements of a signal wire in a mounting region on a module substrate, thus achieving size reduction thereof.

A module device according to a preferred embodiment of the present invention includes a module substrate including an electrode land and a signal wire provided on one main surface thereof; and a filter chip mounted on the module substrate, the filter chip includes a chip substrate including a main surface opposing the one main surface of the module substrate, and a functional electrode portion and a plurality of bumps provided on the chip substrate, the plurality of bumps including a first bump connected to a signal potential, a second bump connected to a ground potential, and a third bump not electrically connected to the functional electrode portion, and the first to third bumps of the filter chip are joined to the module substrate, and the third bump is electrically connected to the signal wire among the electrode land and the signal wire provided on the one main surface of the module substrate, in a mount region obtained by projecting the filter chip onto the one main surface of the module substrate.

In a module device according to a preferred embodiment of the present invention, the filter chip is an elastic wave filter chip, and the chip substrate is a piezoelectric substrate.

In a module device according to a preferred embodiment of the present invention, the third bump is disposed between the first bumps, between the second bumps, or between the first bump and the second bump. In this case, it is possible to further reduce the size of the module device.

In a module device according to a preferred embodiment of the present invention, a chip-side electrode land joined to the third bump is provided on the main surface of the chip substrate.

In a module device according to a preferred embodiment of the present invention, a chip-side electrode land joined to the third bump is laminated on the main surface of the chip substrate with another material layer interposed therebetween.

In a module device according to a preferred embodiment of the present invention, the other material layer is made of a dielectric having a dielectric constant lower than that of the chip substrate. In this case, deterioration of electrical characteristics of the module device is unlikely to occur.

In a module device according to a preferred embodiment of the present invention, the signal wire is electrically connected to the first bump and extended to outside of the mount region.

In a module device according to a preferred embodiment of the present invention, the module device further includes another electronic component chip mounted on the one main surface of the module substrate and different from the filter chip, and the signal wire is electrically connected to the other electronic component chip.

In a module device according to a preferred embodiment of the present invention, the module device further includes first and second electronic component chips mounted on the one main surface of the module substrate and different from the filter chip, and the first and second electronic component chips are electrically connected to each other by the signal wire. In this case, it is possible to further reduce the size of the module device.

In a module device according to a preferred embodiment of the present invention, the mount region has a rectangular or substantially rectangular shape, and the signal wire is extended to outside of the mount region across different sides of the rectangular or substantially rectangular shape. In this case, it is possible to further reduce the size of the module device.

In a module device according to a preferred embodiment of the present invention, the elastic wave filter chip includes an interdigital transducer electrode as the functional electrode portion, the elastic wave filter chip includes, on the piezoelectric substrate, a support layer surrounding the interdigital transducer electrode and a cover sealing an opposing portion of the support layer, and the elastic wave filter chip is mounted on the one main surface of the module substrate such that the cover side thereof opposes the one main surface of the module substrate.

With the module devices according to preferred embodiments of the present invention, it is possible to increase the flexibility in arrangement of a signal wire on the module substrate and in a mount region in which the filter chip is mounted. Therefore, it is possible to reduce the size of the module device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

It should be noted that each preferred embodiment described in the present specification is illustrative, and the components in the different preferred embodiments may be partially replaced or combined.

Figure 1:
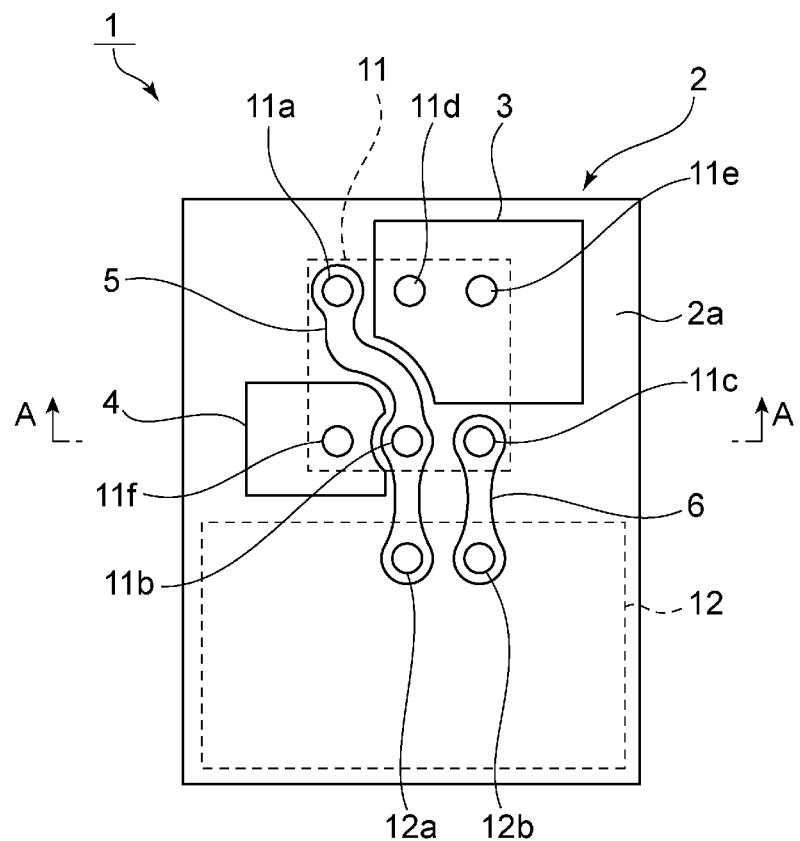
FIG. 1 is a schematic plan view of a module device according to a first preferred embodiment of the present invention.

FIG. 1 is a schematic plan view of a module device according to a first preferred embodiment of the present invention.

The module device 1 includes a module substrate 2. The module substrate 2 includes an upper surface 2a as one main surface. A plurality of electrode lands 3 and 4 connected to a ground potential are provided on the upper surface 2a. Signal wires 5 and 6 are also provided on the upper surface 2a.

The module substrate 2 is made of an appropriate insulating material or semiconductor material, for example. The electrode lands 3 and 4 and the signal wires 5 and 6 are each made of a metal film. The metal film may be a laminated metal film obtained by laminating a plurality of metal films, for example.

A filter chip 11 is mounted on the module substrate 2. In FIG. 1, a mount region in which the filter chip 11 is mounted is shown by a broken line.

The mount region refers to a region obtained by projecting the filter chip 11 onto the upper surface 2a of the module substrate 2. Another electronic component chip 12 different from the filter chip 11 is also mounted on the module substrate 2. Regarding the electronic component chip 12 as well, a portion in which the electronic component chip 12 is mounted is schematically shown by a broken line.

Figure 2:
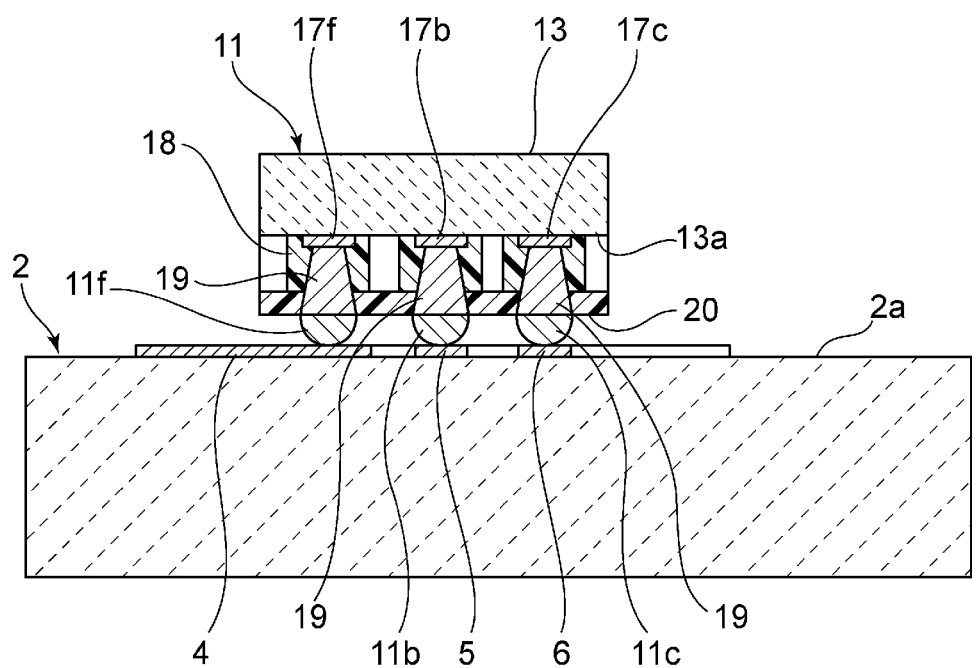
FIG. 2 is a cross-sectional view of the module device of the first preferred embodiment of the present invention, corresponding to a portion taken along a line A-A in FIG. 1.

In the present preferred embodiment, the filter chip 11 is preferably an elastic wave filter chip, for example. The elastic wave filter chip includes a plurality of bumps 11a to 11f shown by circles in FIG. 1. The bumps 11a to 11f are joined to the electrode lands 3 and 4 or the signal wires 5 and 6 on the upper surface 2a of the module substrate 2. The bumps 11a and 11c are first bumps, the bumps 11d, 11e, and 11f are second bumps connected to the ground potential, and the bump 11b is a third bump which is a floating bump described later. These bumps will be more specifically described with reference to FIG. 2. FIG. 2 is a cross-sectional view of the module device 1, corresponding to a portion taken along a line A-A in FIG. 1.

In FIG. 2, a cross-section of a portion in which the bumps 11b, 11c, and 11f of the plurality of bumps 11a to 11f described above are provided is shown. The bump 11f is joined to the electrode land 4. The bump 11b is connected to the signal wire 5. The bump 11c is joined to the signal wire 6.

The filter chip 11 includes a piezoelectric substrate 13 as a chip substrate. The piezoelectric substrate 13 is preferably made from a piezoelectric monocrystal, such as $LiTaO_3$ or $LiNbO_3$, for example. Piezoelectric ceramics may be used, instead of the piezoelectric monocrystal.

Figure 3:
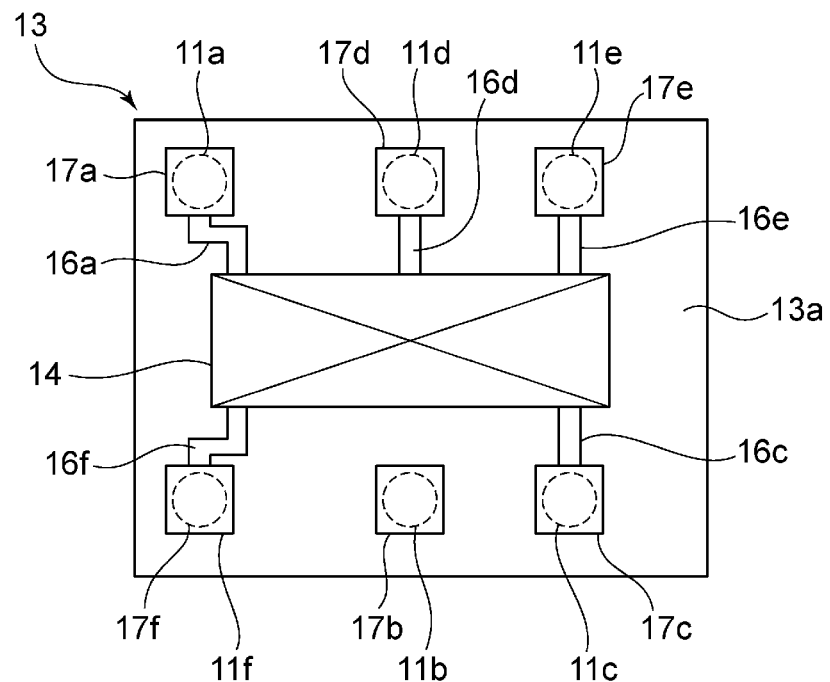
FIG. 3 is a bottom view showing an electrode structure on a first main surface of a filter chip in the module device of the first preferred embodiment of the present invention.

An electrode structure provided on a main surface 13a of the piezoelectric substrate 13 opposing the module substrate 2 is shown in a bottom view of FIG. 3. A functional electrode portion 14 is provided on the main surface 13a. In the present preferred embodiment, the functional electrode portion 14 includes a plurality of interdigital transducer electrodes and defines a band pass surface acoustic wave filter. However, in the present invention, the electrode structure of the functional electrode portion 14 is not particularly limited, and an appropriate electrode structure defining a filter circuit may be used, for example.

Ends of extended electrodes 16a and 16c to 16f are connected to the functional electrode portion 14. The other ends of the extended electrodes 16a and 16c to 16f are connected to chip-side electrode lands 17a and 17c to 17f. The bumps 11a and 11c to 11f are joined to the chip-side electrode lands 17a and 17c to 17f. Here, the bumps 11a and 11c are first bumps electrically connected to the signal wire 5 or 6. The first bumps 11a and 11c are connected to the functional electrode portion 14 via the chip-side electrode lands 17a and 17c.

The second bumps 11d, 11e, and 11f are connected to the ground potential of the functional electrode portion 14 via the extended electrodes 16d, 16e, and 16f and chip-side electrode lands 17d, 17e, and 17f.

On the other hand, the chip-side electrode land 17b is not electrically connected to the functional electrode portion 14. The third bump 11b is provided on the chip-side electrode land 17b. Therefore, the third bump 11b is a floating bump that is not electrically connected to the functional electrode portion 14. Here, the floating bump refers to a bump that is not electrically connected to a signal potential or a ground potential in the filter chip 11 and is in an electrically floating state. The third bump 11b is joined to the signal wire 5 in the mount region as shown in FIGS. 1 and 2.

Referring back to FIG. 2, at a portion in which the chip-side electrode lands 17b, 17c, and 17f are provided, a support layer 18 preferably made of an insulating material, for example, is provided on the main surface 13a of the piezoelectric substrate 13. Through holes penetrate the support layer 18. The support layer 18 is preferably made from a synthetic resin or an inorganic insulating material, for example.

A cover 20 is provided at the end side of the support layers 18. The cover 20 is preferably made from a synthetic resin or an inorganic insulating material, for example. The portion surrounded by the cover 20 and the support layer 18 is referred to as a hollow portion and sealed. The functional electrode portion 14 is located in the hollow portion.

As shown in FIG. 2, a through hole penetrates the support layer 18 and the cover 20. An under-bump metal layer 19 is provided in each through hole. The under-bump metal layers 19 are provided on the chip-side electrode lands 17b, 17c, and 17f. Each under-bump metal layer 19 is preferably made from a metal or an alloy, for example.

The third bump 11b, first bump 11c, and second bump 11f are provided on the under-bump metal layers 19.

As described above, the filter chip 11 has a WLP package structure having the piezoelectric substrate 13, the support layer 18, and the cover 20. The filter chip 11 is mounted on the module substrate 2 using the bumps 11a to 11f by a face-down method.

Of course, in the present invention, the filter chip is not limited to having a wafer level packaging (WLP) structure. A filter chip having an appropriate package structure, such as a chip scale packaging (CSP) structure may be used.

In the present preferred embodiment, the third bump 11b, which is a floating bump, is joined to the signal wire 5 in the mount region. This feature will be described in detail with reference to FIG. 1.

The signal wire 5 is provided on the upper surface 2a of the module substrate 2 so as to electrically connect the filter chip 11 and the electronic component chip 12. The signal wire 5 is a wire through which a signal current flows.

The first bump 11a is electrically connected to the functional electrode portion 14, and a signal flows from the first bump 11a to the signal wire 5 and reaches a bump 12a connected to the electronic component chip 12.

Meanwhile, the third bump 11b, which is a floating bump, is not connected to the functional electrode portion 14 or the ground potential. However, the third bump 11b, which is a floating bump, is also joined to the signal wire 5. That is, the third bump 11b, which is a floating bump, is also joined to the signal wire 5 in the rectangular or substantially rectangular mount region obtained by projecting the filter chip 11 onto the upper surface 2a of the module substrate 2.

In the present preferred embodiment, the third bump 11b, which is a floating bump, is provided at a position between the second bump 11f and the first bump 11c. Therefore, in the rectangular or substantially rectangular mount region, the signal wire 5 is extended from the side at which the signal wire 5 is joined to the first bump 11a, through the gap between the second bump 11f and the first bump 11c, to the electronic component chip 12 side.

In the related art, a floating bump is usually joined to an electrode land connected to a ground potential. Therefore, it is conceivable to join the third bump 11b in FIG. 1 to an extension of the electrode land 4 or the electrode land 3. However, with such a configuration, it is difficult to extend, or route the signal wire 5 in the mount region. For example, the signal wire 5 has had to be extended, or routed outside the mount region. Therefore, size reduction has been difficult.

On the other hand, in the module device 1, it is possible to dispose the signal wire 5 such that the third bump 11b, which is a floating bump, is joined to the signal wire 5 in the mount region. Therefore, the flexibility in arrangement of the signal wire 5 in the mount region is increased, and thus it is possible to effectively achieve size reduction.

In addition, since the third bump 11b, which is a floating bump, is also joined to the signal wire 5, the joining strength of the filter chip 11 to the module substrate 2 is sufficiently improved by the multiple bumps 11a to 11f in the present preferred embodiment.

Figure 4:
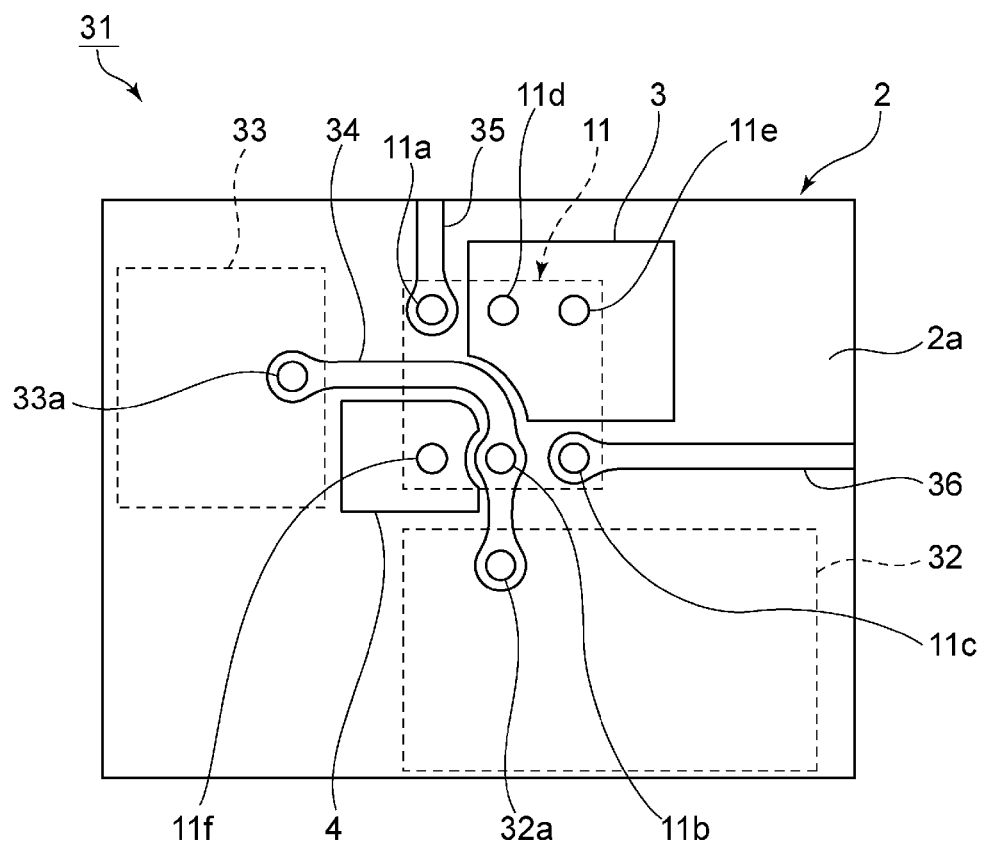
FIG. 4 is a schematic plan view of a module device according to a second preferred embodiment of the present invention.

FIG. 4 is a schematic plan view of a module device according to a second preferred embodiment of the present invention.

In a module device 31, similar to the first preferred embodiment, a filter chip 11 is mounted on an upper surface 2a of a module substrate 2. The filter chip 11 is the same or substantially the same as the filter chip 11 used in the first preferred embodiment, and includes first bumps 11a and 11c, second bumps 11d, 11e, and 11f, and a third bump 11b. In the module device 31, in addition to the filter chip 11, a plurality of electronic component chips 32 and 33 are mounted on the upper surface 2a of the module substrate 2. The electronic component chip 32 includes a bump 32a connected to a signal potential. The electronic component chip 33 includes a bump 33a connected to the signal potential.

Electrode lands 3 and 4 connected to a ground potential and signal wires 34 to 36 connected to a signal potential are provided on the upper surface 2a of the module substrate 2. Among them, the first bump 11a is joined to the signal wire 35, and the first bump 11c is joined to the signal wire 36. The third bump 11b, which is a floating bump, is joined to the signal wire 34. The signal wire 34 is not electrically connected to the filter chip 11. The signal wire 34 electrically connects the electronic component chip 32 and the electronic component chip 33. That is, the bump 32a and the bump 33a are connected to each other by the signal wire 34.

As described above, in the present referred embodiment, the third bump 11b, which is a floating bump, may be joined to the signal wire 34, which is not electrically connected to the filter chip 11. In this case as well, it is possible to increase the flexibility in arrangement of the signal wire 34 in a mount region obtained by projecting the filter chip 11 onto the upper surface 2a of the module substrate 2. Therefore, an extra space is not required to extend the signal wire 34, and thus it is possible to achieve size reduction. In addition, the filter chip 11 is joined to the module substrate 2 also by the third bump 11b, which is a floating bump, and thus the joining strength of the filter chip 11 and the module substrate 2 is sufficiently improved.

As in the module device 31, the signal wire 34 to which the third bump 11b, which is a floating bump, is joined may join the other electronic component chips 32 and 33 of the filter chip 11 to each other.

In the module device 31, the signal wire 34 connects different sides of the rectangular or substantially rectangular mount region. That is, the signal wire 34 includes a portion in the mount region, a portion extended to an outer side portion of one side of the mount region, and a portion extended to an outer side portion of another side of the mount region. By shortening the connection length of the signal wire 34 between the electronic component chips 32 and 33, it is possible to achieve further size reduction. The signal wire 34 does not necessarily need to be extended to outer side portions from each of two adjacent sides of the mount region. The signal wire 34 may be extended from any two sides of the mount region to the outside of the mount region. Alternatively, the signal wire 34 may be extended from the same side of the mount region to the outside of the mount region. That is, a position through which the signal wire 34 reaches an outer side portion of the mount region is preferably selected in accordance with the position of the electronic component chip 32 or 33 located outside the mount region.

Figure 5:
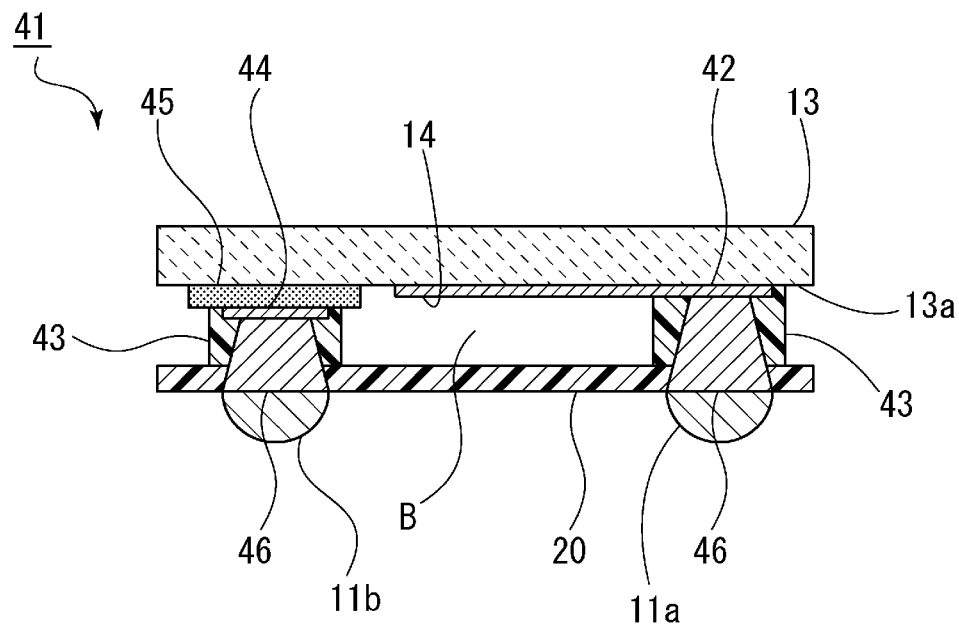
FIG. 5 is a front cross-sectional view showing a main portion of a filter chip mounted on a module substrate in a third preferred embodiment of the present invention.

FIG. 5 is a front cross-sectional view showing a main portion of a filter chip mounted on the module substrate included in a module device according to a third preferred embodiment of the present invention.

A filter chip 41 includes a piezoelectric substrate 13. Similar to the filter chip 11, a functional electrode portion 14 is provided on a main surface 13a of the piezoelectric substrate 13 opposing the module substrate 2. In FIG. 5, only an electrode portion which is a portion of the functional electrode portion 14 is shown. A support layer 43 is provided on an electrode land 42 joined to the functional electrode portion 14. In addition, an electrode land 44 is provided on the main surface 13a with a dielectric layer 45 interposed therebetween. The dielectric constant of the dielectric layer 45 is preferably lower than the dielectric constant of the piezoelectric substrate 13. As the material for a dielectric layer 45, for example, a synthetic resin, such as polyimide, or an inorganic insulating material, such as silicon oxide, may preferably be used as appropriate.

The electrode land 44 is not electrically connected to the functional electrode portion 14, that is, is provided as a floating electrode land.

The layer 43 covers the electrode land 44. A cover 20 is provided on the support layer 43. A hollow portion B is provided by the support layer 43 and the cover 20. The functional electrode portion 14 faces the hollow portion B.

In the present preferred embodiment, through holes penetrate the support layer 43 and the cover 20. An under-bump metal layer 46 is provided in each through hole. A third bump 11b preferably is a floating bump on the under-bump metal layer 46 on the electrode land 44. In addition, a first bump 11a connected to a signal potential is electrically connected to the electrode land 42. As described above, the electrode land 44 to which the third bump 11b, which is a floating bump, is joined does not have to be in direct contact with the main surface 13a of the piezoelectric substrate 13. That is, the electrode land 44 may be provided on the main surface 13a of the piezoelectric substrate 13 with the dielectric layer 45, as another material layer, interposed therebetween. In addition, as in the present preferred embodiment, the dielectric layer 45 is preferably used as another material layer. Of course, a material layer other than the dielectric layer 45 may be used as another material layer.

When the dielectric layer 45 is provided as in the present preferred embodiment, it is possible to improve filter characteristics in the module device. This will be described with reference to FIG. 6.

Figure 6:
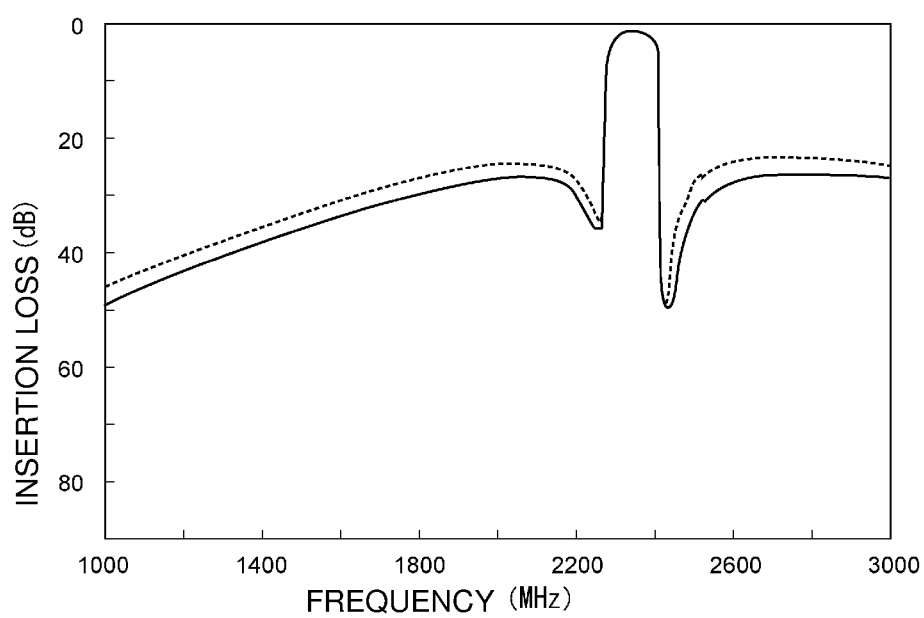
FIG. 6 is a diagram showing filter characteristics of a module device of the third preferred embodiment of the present invention and a module device in which no dielectric layer is provided.

FIG. 6 is a diagram showing the filter characteristics of the filter chip in the module device according to the third preferred embodiment, and a solid line indicates the results of the third preferred embodiment. In addition, a broken line indicates the filter characteristics of a module device that is configured similarly to the third preferred embodiment, except that the dielectric layer 45 is not provided therein.

In FIG. 6, the solid line indicates the results obtained in the case of using polyimide for the dielectric layer 45. As is obvious from FIG. 6, it appears that in the case of using polyimide for the dielectric layer 45, it is possible to sufficiently reduce attenuation outside the pass band as compared to the case without the dielectric layer 45. This is considered to be due to inhibition of influence by capacitive coupling of a signal entering the third bump 11b, which is a floating bump, since the dielectric constant of the dielectric layer 45 is lower than the dielectric constant of the piezoelectric substrate 13. Thus, it is preferable to provide the dielectric layer 45 as described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module device comprising:
    a module substrate including an electrode land and a signal wire provided on one main surface thereof; and
    a filter chip mounted on the module substrate; wherein
    the filter chip includes a chip substrate including a main surface opposing the one main surface of the module substrate, and a functional electrode portion and a plurality of bumps provided on the chip substrate, the plurality of bumps including a first bump connected to a signal potential, a second bump connected to a ground potential, and a third bump not electrically connected to the functional electrode portion; and
    the first to third bumps of the filter chip are joined to the module substrate, and the third bump is electrically connected to the signal wire among the electrode land and the signal wire provided on the one main surface of the module substrate, in a mount region defined by the filter chip projected onto the one main surface of the module substrate.

2. The module device according to claim 1, wherein the filter chip is an elastic wave filter chip, and the chip substrate is a piezoelectric substrate.

3. The module device according to claim 1, wherein
    the elastic wave filter chip includes an interdigital transducer electrode defining the functional electrode portion, and the elastic wave filter chip on the piezoelectric substrate, a support layer surrounding the interdigital transducer electrode and a cover sealing an opposing portion of the support layer; and
    the elastic wave filter chip is mounted on the one main surface of the module substrate such that a cover side thereof opposes the one main surface of the module substrate.

4. The module device according to claim 3, wherein the support layer is made from a synthetic resin or an inorganic insulating material.

5. The module device according to claim 3, wherein the cover is made from a synthetic resin or an inorganic insulating material.

6. The module device according to claim 2, wherein the piezoelectric substrate is made of $LiTaO_3$ or $LiNbO_3$.

7. The module device according to claim 1, wherein the third bump is disposed between the first bumps, between the second bumps, or between the first bump and the second bump.

8. The module device according to claim 1, wherein a chip-side electrode land joined to the third bump is provided on the main surface of the chip substrate.

9. The module device according to claim 1, wherein a chip-side electrode land joined to the third bump is laminated on the main surface of the chip substrate with another material layer interposed therebetween.

10. The module device according to claim 9, wherein the another material layer is made from a dielectric having a dielectric constant lower than that of the chip substrate.

11. The module device according to claim 1, wherein the signal wire is electrically connected to the first bump and extended to outside of the mount region.

12. The module device according to claim 11, further comprising:
    another electronic component chip mounted on the one main surface of the module substrate and different from the filter chip; wherein the signal wire is electrically connected to the another electronic component chip.

13. The module device according to claim 1, further comprising:
first and second electronic component chips mounted on the one main surface of the module substrate and different from the filter chip; wherein
the first and second electronic component chips are electrically connected to each other by the signal wire.

14. The module device according to claim 13, wherein the mount region has a rectangular or substantially rectangular shape, and the signal wire is extended to outside of the mount region across different sides of the rectangular or substantially rectangular shape.

15. The module device according to claim 1, wherein the electrode land and the signal wire are each made from a metal film.

16. The module device according to claim 1, wherein the module substrate is made of an insulating material or a semiconductor material.

* * * * *